United States Patent [19]

McGahay et al.

[11] Patent Number: 5,712,702
[45] Date of Patent: Jan. 27, 1998

[54] METHOD AND APPARATUS FOR DETERMINING CHAMBER CLEANING END POINT

[75] Inventors: Vincent James McGahay, Poughkeepsie, N.Y.; James Gardner Ryan, Newtown, Conn.; Michael Jay Shapiro, Austin, Tex.; Christopher Joseph Waskiewicz, Poughkeepsie, N.Y.

[73] Assignee: International Business Machines Corporation, Armonk, N.Y.

[21] Appl. No.: 761,169

[22] Filed: Dec. 6, 1996

[51] Int. Cl.$^6$ .................................................. G01J 3/443
[52] U.S. Cl. ........................................ 356/311; 356/326
[58] Field of Search ................................ 356/311, 316, 356/326, 328; 156/626.1; 250/302

[56] References Cited

U.S. PATENT DOCUMENTS

| | | | |
|---|---|---|---|
| 4,975,141 | 12/1990 | Greco et al. | 156/626 |
| 5,261,998 | 11/1993 | Kanetake et al. | 156/626 |
| 5,465,154 | 11/1995 | Levy | 356/382 |
| 5,486,235 | 1/1996 | Ye et al. | 134/1.1 |
| 5,536,359 | 7/1996 | Kawada et al. | 156/626.1 |

FOREIGN PATENT DOCUMENTS

| | | | |
|---|---|---|---|
| 63-14421 | 1/1988 | Japan | 356/311 |
| 4-032227 | 2/1992 | Japan | . |
| 5-160272 | 6/1993 | Japan | . |

*Primary Examiner*—F. L. Evans
*Attorney, Agent, or Firm*—Michael J. Balconi Lamica, Esq.; Jenkens & Gilchrist, P.C.; Susan M. Murray, Esq.

[57] ABSTRACT

A marker element is included in a deposition chamber. After use of the chamber to deposit films or coatings on workpieces, the chamber is cleaned to remove materials which may contaminate future processing of workpieces in the chamber. The composition of the gas exhausted from the chamber during the cleaning process is monitored, and a characteristic of the marker element is sensed. The cleaning gas is terminated in response to the sensed characteristic of the marker element having a predetermined value, such as a peak intensity or the return to a baseline value after peaking. The present invention effectively solves the problem of overcleaning or undercleaning the chamber based upon an estimated film thickness build up.

19 Claims, 2 Drawing Sheets

METHOD AND APPARATUS FOR DETERMINING CHAMBER CLEANING END POINT

BACKGROUND OF THE INVENTION

1. Technical Field

This invention relates generally to a method for cleaning a film deposition chamber, and more particularly to such a method and an apparatus, adapted for carrying out the method, that includes a means of detecting the end point of the cleaning process.

2. History of Related Art

Chambers used for thin film deposition require periodic cleaning to avoid flaking or spalling of material from the chamber walls, which may contaminate film coatings deposited on a workpiece in the chamber. There are two methods in which chamber cleaning is usually implemented. In the first, the cleaning process is carried out for a set period of time. Generally, the time is sufficiently long to include an overcleaning, by which removal of all film from the chamber walls is assured. The problem with this approach is that overcleaning reduces the productivity of the tool and can eventually cause damage to the chamber walls.

An improved method of controlling the length of the cleaning process is to use a means of end point detection, whereby the cleaning process can be stopped after all of the previously deposited material is removed from the wall of the chamber. One such method of end point detection for chamber cleaning is the use of optical emission spectroscopy (OES). In this method, the intensity of an emission signal characteristic of a cleaning byproduct is monitored until it disappears, indicating that the end point has been reached. For example, cleaning of a silicon dioxide ($SiO_2$) deposition chamber using fluorine-containing gases can be used to indicate the end point of a cleaning process by monitoring silicon-related species. This method only works, however, when the chamber walls contain a material different from that being deposited. If the chamber walls are constructed, either in whole or in substantial part, of $SiO_2$, it is difficult or impossible to determine the point at which the deposited $SiO_2$ films are etched away, and the etching of the chamber wall itself begins. Sensing silicon-related peaks in the exhaust gas in systems where there is a large quantity of $SiO_2$ in the tool is difficult due to large amounts of background interference.

Furthermore, the deposition rate of films deposited on workpieces may vary from day to day to provide different thicknesses of films, not only on the workpiece, but also on the chamber walls. Therefore, conducting a cleaning process for a set period of time may easily result in over or under cleaning, both of which can produce problems.

The present invention is directed to overcoming the problems set forth above. It is desirable to have a method for determining the end point for chamber cleaning, where the chamber is wholly or partially constructed of the same material as that deposited in the chamber during its normal deposition operation. Furthermore, it is desirable to have a method that is also effective for determining the end point for chamber cleaning where the chamber is constructed of a different material than that deposited in the chamber during its normal deposition operation. It is also desirable to have such a method that effectively reduces either overcleaning or undercleaning when varying film thicknesses are deposited on the chamber walls. In addition, it is also desirable to have an apparatus specifically adapted for carrying out the above method for determining an end point for chamber cleaning.

SUMMARY OF THE INVENTION

In accordance with one aspect of the present invention, a method for determining an end point for a chamber cleaning process includes depositing a seasoning film containing a marker element on the interior walls of the chamber. A workpiece is then placed in the chamber, and a coating of a preselected material is deposited on the workpiece and on the interior walls of the chamber. After removing the workpiece from the chamber, a cleaning gas is directed through the chamber. The cleaning gas has a composition sufficient to remove the coating and the seasoning film from the interior walls of the chamber. The composition of gases exhausted from the chamber is sensed, and the flow of cleaning gas through the chamber terminated in response to sensing a predefined characteristic of the marker element in the gases exhausted from the chamber.

Other features of the method for determining an end point for a chamber cleaning process embodying the present invention includes carrying out the method in a chamber adapted for the deposition of a coating on a workpiece by chemical vapor deposition. Other features include the deposition of the seasoning film containing a marker element on the interior walls of the chamber by flowing a gaseous mixture containing tetraethoxy silane, oxygen, helium, and the marker element through the chemical vapor deposition chamber. Still other features include the marker element being selected from the group consisting of xenon, krypton, and a phosphorus-containing compound. Still other features of the method for determining an end point for a chamber cleaning process includes sensing the composition of gases exhausted from the chamber with an optical emission spectrometer and sensing a peak emission intensity of the marker element in a subsequent return of the marker element emission intensity to a base line value, whereupon the cleaning process is terminated.

In accordance with another aspect of the present invention, an apparatus for determining an end point for a chamber cleaning process includes a chamber adapted for deposition of a coating on a workpiece, a marker element disposed in the chamber, and a means for analyzing the composition of gases exhausted from said chamber during cleaning of the chamber.

Other features of the apparatus embodying the present invention include the marker element being alternatively incorporated in a film deposited on the internal wall surfaces of the chamber, in a patch disposed in the chamber, or in a support means for the workpiece. Other features included the patch having multiple layers of the marker element.

BRIEF DESCRIPTION OF THE DRAWINGS

A more complete understanding of the method for determining an end point for a chamber cleaning process embodying the present invention may be had by reference to the following detailed description when taken in conjunction with the accompanying drawing, wherein.

DETAILED DESCRIPTION OF PRESENTLY PREFERRED EXEMPLARY EMBODIMENTS

As described above, it is necessary to periodically clean the interior walls of coating deposition chambers, such as chemical vapor deposition (CVD) chambers, plasma enhanced chemical vapor deposition (PECVD) chambers and high density plasma chemical vapor deposition (HDPCVD) chambers used in the formation of insulating and conductive films in the production of solid state electronic devices, to prevent contamination of the respective films in the formed articles. After cleaning, season steps are commonly used to condition the chamber walls to insure that film deposited in subsequent workpiece processing has good adherence and will not flake or spall before it is removed in a later cleaning step.

In the method embodying the present invention, a marker element, preferably an inert gas or other composition not normally found in the atmosphere, such as xenon, krypton, or phosphorus-containing compositions such as trimethyl phosphite, triethyl phosphate and phosphine, is either disposed in the chamber prior to processing of workpieces in the chamber or included in gaseous mixture flowing through the chamber during cleaning after workpiece processing.

By way of a specific example, a marker film containing xenon (xe) as the marker element was applied to the interior walls of an aluminum-walled parallel plate PECVD reactor after the chamber was cleaned and seasoned. The marker element was deposited by flowing a gaseous mixture containing tetraethoxy silane (TEOS), oxygen, helium, and xenon. The gaseous mixture had a total flow rate of 2700 sccm through the chamber. The flow control valve for each of the individual gases was set as follows: 800 sccm for TEOS, 700 sccm for oxygen, 700 sccm for helium, and 500 sccm for xenon. A wafer, representing a dummy workpiece, was placed in the chamber during the marker film deposition and maintained at a temperature of about 400° C. High frequency power at about 13.56 MHz and 110 W, and low frequency power at about 350 kHz and 340 W, was applied to the wafer. A pressure of about 5 torr was maintained in the chamber during the process. The flow of the above gas mixture was maintained through the chamber for about 60 seconds.

Figure 1:
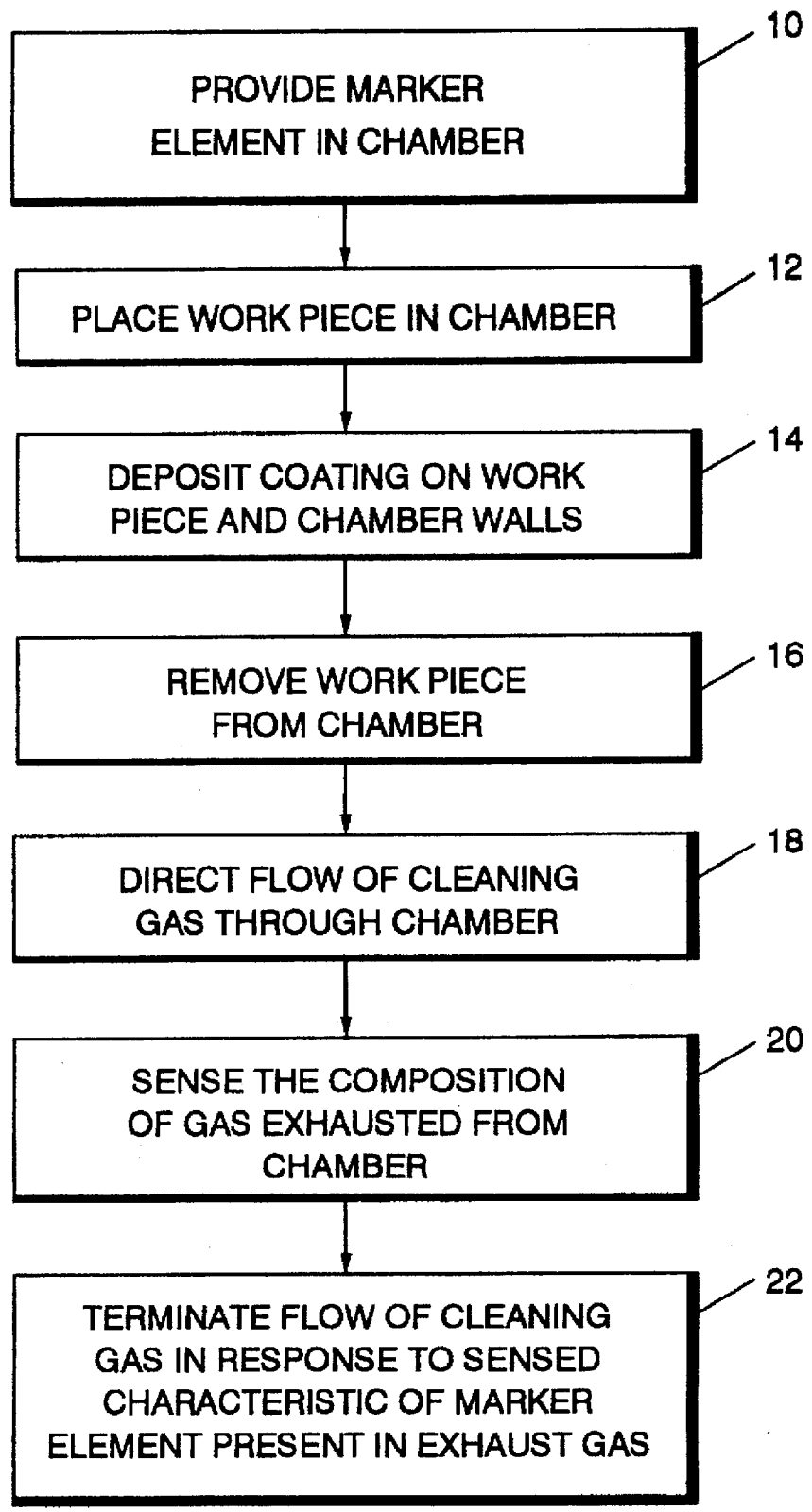
FIG. 1 is a flow chart illustrating the principle steps carried out in the method, embodying the present invention, for determining and end point for a chamber cleaning process.

In the method embodying the present invention, the above-described marker film deposition is represented by block 10 in the flow chart shown in FIG. 1. Alternatively, the marker element may be deposited within the season film itself, incorporated in a patch mounted in a preselected area of the chamber, or provided in a component of the tool set such as a support member for a workpiece.

After deposition or other provision for a marker element in the deposition chamber, a workpiece is placed in the chamber, as represented at block 12, and a coating of a preselected material, for example, $SiO_2$, is deposited to form an insulation film on the workpiece and, concurrently, on the interior walls and other internal surfaces of the chamber, as indicated at block 14. The coating process is typically repeated a predetermined number of cycles before the chamber is cleaned.

After deposition of the desired coatings and/or other accompanying processes such as etching, the workpiece is removed from the chamber, as represented at block 16, and a flow of cleaning gas is directed through the chamber, as indicated at block 18. The cleaning gas has a composition sufficient to remove the particular applied coating and the seasoning film from the interior walls and surfaces of the chamber. For example, cleaning of a $SiO_2$ deposition chamber is commonly carried out using fluorine-containing gases, such as $SF_6$, $CF_4$, $C_2F_6$, and $NF_3$.

The flow of cleaning gas is maintained through the chamber, as represented at block 18, while sensing the composition of the gas exhausted from the chamber, as represented at box 20. More specifically, if xenon is used as the marker element, the composition of the gas exhausted from the chamber is desirably sensed by an optical emission spectrometer to monitor the intensity, i.e., concentration, of xenon at the 828 nm wavelength. In an actual test of the method embodying the present invention, high frequency power at about 13.56 MHz and 950 W, was applied to the chamber electrode during the cleaning process.

In a first test, a single layer of a typical seasoning film was applied to the interior walls of the chamber as described above, followed by a single layer of a marker film applied to both the walls and the workpiece. In a second example a double coating of the marker film was applied to both the walls and the workpiece after deposition of a single layer of the seasoning film. The marker film, in both examples, was deposited by flowing the above-described TEOS/O/He/Xe gaseous mixture through the CVD chamber while maintaining the aforementioned high frequency power parameters. A fluorine-containing gaseous mixture was directed through the chamber and a high frequency plasma established. In the first example, it was observed that the 828 nm emission, representative of xenon, peaked after about 16 seconds into the cleaning cycle and returned to a base, or background value, after about 24 seconds of the cycle, representing depletion of the seasoning film and, accordingly, the desired end point of the cleaning process. In the second test example, in which a double thickness of marker film was applied, the 828 nm intensity representative of xenon peaked after about 27 seconds into the cycle and returned to a baseline level after about 38 seconds.

Thus, it can be seen that, by monitoring the emission intensity at a wavelength representative of a marker element component in a season film, a separate film, or a patch or other component of the deposition apparatus, not only can the peak concentration of that element in the exhaust gas be observed, but also the point at which the marker element is no longer present following peak emission intensity can be sensed, indicating removal of the film containing the marker element. These characteristics provide a reliable indication upon which the end point, i.e., the point at which the cleaning cycle can be terminated by discontinuing the flow of cleaning gas through the chamber, can be determined as indicated at block 22.

Figure 2:
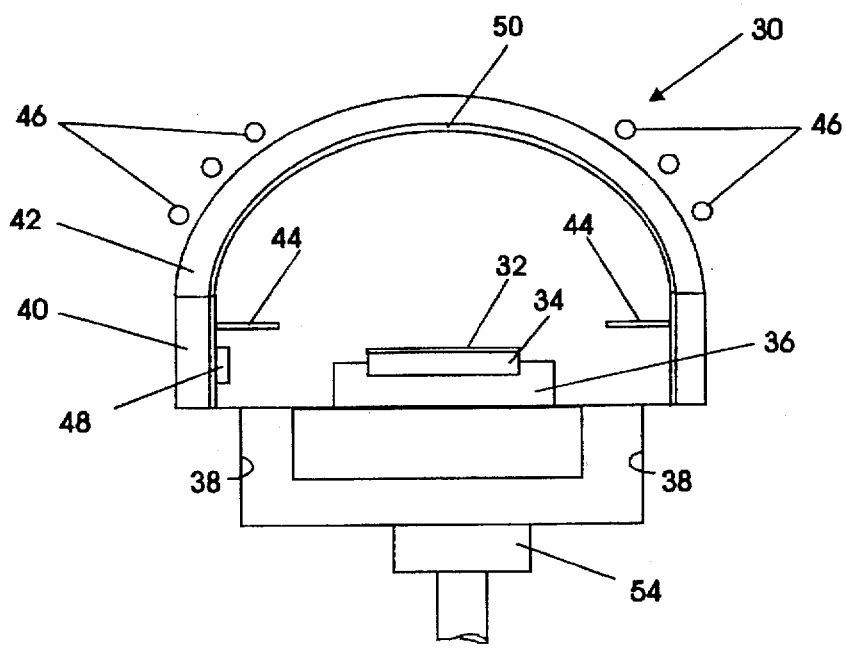
FIG. 2 is a schematic diagram of an apparatus embodying the present invention.

An apparatus 30, adapted for carrying out the method for determining an end point for a chamber cleaning process, is illustrated in FIG. 2. The illustrated apparatus 30 represents a conventional high density plasma chemical vapor deposition (HDPCVD) chamber having internal wall surfaces defined by a dome 42 spanning a cylindrical wall 40. RF power is applied to a workpiece 32 by a coil structure 46 disposed externally of the chamber. The workpiece 32 is mounted on an electrostatic chuck 34 which supports and provides bias RF power to the workpiece 32. Typically, a collar 36 surrounds the chuck 34. A plurality of gas inlet nozzles 44, selectively connected to a source, not shown, of the process or cleaning gas as appropriate for a specific operation, extend through the chamber wall 40 into the chamber. Exhaust outlets 38 provide a passageway for the flow of gas from the chamber A means 54 for analyzing the composition of gas exhausted from the chamber, such as an optical emission spectrometer, is disposed in fluid communication with the exhaust outlets 38.

Figure 3:
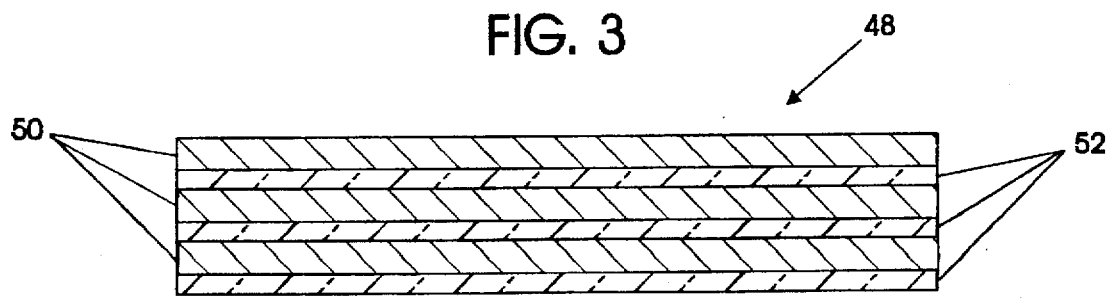
FIG. 3 is a cross-sectional view of a patch comprising multiple layers of a marker film and mountable within the chamber of the apparatus embodying the present invention.

In the apparatus 30 embodying another aspect of the present invention, the marker element used for determining a chamber cleaning end point by the above-described method, may be provided by the described film deposition process in which the marker element is deposited as a film 50 on the internal wall surfaces of the chamber. Alternatively, the marker element may be incorporated in a patch 48 constructed of a single marker film 50, or of alternating layers of marker film 50 and non-marker film 52, as shown in FIG. 3. The patch 48 may disposed at a convenient position in the chamber and provides a source of the marker element when the cleaning process approaches a desirable end point, as described above. The multiple-layer patch provides a marker element indicator for a plurality of cleaning operations. In yet another arrangement, the marker element may be incorporated with the materials of construction in an appropriate part of the chamber, i.e., preferably a part or component of the apparatus 30 that would be etched more slowly during the cleaning process than other components. For example, suitable parts of the apparatus 30 for incorporation of a marker element include the collar 36 surrounding the electrostatic chuck 34, the chamber wall 40, the dome 42, and the gas inlet nozzles 44. Desirably, only one of the above alternative sources of a marker element are included in the apparatus 30, although both a patch 48 and a marker film 50 deposited on the internal walls of the chamber are shown in FIG. 2 for the discussion purposes.

It should also be noted that other means for analyzing the composition of exhaust gases discharged from the chamber during cleaning, for example other residual gas analysis (RGA) techniques may be included in the apparatus 30 and used in carrying out the method embodying the present invention. Also, other marker elements, season film compositions and cleaning gas compositions, different from those presented as specific examples, may be used.

Thus, it can be seen that the above described method for determining an end point for a chamber cleaning process and an apparatus specifically adapted for carrying out the method, in accordance with the present invention, provides a way to determine a chamber cleaning end point that is less dependent on normal changes in deposition rate due to day-to-day variation, or changes that occur when tool hardware is replaced. Also, since cleaning times and procedures are now typically set up for specific film thicknesses, the method embodying the present invention will effectively reduce overcleaning or undercleaning when non-standard film thicknesses are deposited.

Although the present invention is described in terms of preferred exemplary embodiments, with specific illustrative gas compositions, gas analysis techniques and marker element arrangements, those skilled in the art will recognize that changes in those compositions, techniques and arrangements may be made without departing from the spirit of the invention. Such changes are intended to fall within the scope of the following claims. Other aspects, features, and advantages of the present invention may be obtained from a study of this disclosure and the drawings, along with the appended claims.

What is claimed is:

1. A method for determining an end point for a chamber cleaning process, comprising:
   depositing a marker element in said chamber;
   placing a workpiece in said chamber;
   depositing a coating of a preselected material on said workpiece and on the interior walls of said chamber;
   removing said workpiece from said chamber;
   directing a flow of a cleaning gas through said chamber, said gas having a composition sufficient to remove said coating from the interior walls of said chamber;
   sensing the composition of gases exhausted from said chamber;
   terminating said flow of cleaning gas through said chamber in response to sensing a predefined characteristic of the marker element in said gases exhausted from the chamber.

2. A method for determining an end point for a chamber cleaning process, as set forth in claim 1, wherein said depositing a marker element in said chamber includes depositing a film containing said marker element on the interior walls of said chamber.

3. A method for determining an end point for a chamber cleaning process, as set forth in claim 2, wherein said depositing a film containing a marker element on the interior walls of said chamber comprises flowing a gaseous mixture containing tetraethoxy silane, oxygen, helium and said marker element through said chamber.

4. A method for determining an end point for a chamber cleaning process, as set forth in claim 1, wherein said depositing a marker element in said chamber includes placing a patch containing said marker element in said chamber.

5. A method for determining an end point for a chamber cleaning process, as set forth in claim 1, wherein said depositing a marker element in said chamber includes incorporating said marker element in an internal component of said chamber.

6. A method for determining an end point for a chamber cleaning process, as set forth in claim 1, wherein said chamber is adapted for the deposition of a coating on a workpiece by a chemical vapor deposition process.

7. A method for determining an end point for a chamber cleaning process, as set forth in claim 1, wherein said marker element is selected from the group consisting of xenon, krypton and phosphorous-containing compounds.

8. A method for determining an end point for a chamber cleaning process, as set forth in claim 1, wherein said workpiece is a wafer adapted for the formation of a semiconductor chip.

9. A method for determining an end point for a chamber cleaning process, as set forth in claim 8, wherein said depositing a coating of a preselected material comprises depositing a film of silicon dioxide on said wafer.

10. A method for determining an end point for a chamber cleaning process, as set forth in claim 1, wherein said directing a flow of a cleaning gas through said chamber comprises directing a flow of a fluorine-containing gaseous mixture through said chamber.

11. A method for determining an end point for a chamber cleaning process, as set forth in claim 1, wherein said sensing the composition of gases exhausted from said chamber includes sensing the exhausted gases with an optical emission spectrometer.

12. A method for determining an end point for a chamber cleaning process, as set forth in claim 1, wherein said terminating said flow of cleaning gas through said chamber in response to sensing a predefined characteristic of the marker element in said gases comprises sensing a peak emission intensity of said marker element and a subsequent return of said marker element emission intensity to a baseline value.

13. An apparatus for determining an end point for a chamber cleaning process, comprising:
   a chamber defined by internal wall surfaces and adapted for deposition of a coating on a workpiece;
   means for supporting said workpiece in said chamber;
   a marker element disposed in said chamber;
   an exhaust passageway in communication with said chamber; and
   means for analyzing the composition of exhaust gases discharged from said chamber during cleaning of the chamber.

14. An apparatus, as set forth in claim 13, wherein said marker element is incorporated in a film deposited on the internal wall surfaces of said chamber.

15. An apparatus, as set forth in claim 13, wherein said marker element is incorporated in a patch disposed in said chamber.

16. An apparatus, as set forth in claim 15, wherein said patch includes multiple layers of said marker element.

17. An apparatus, as set forth in claim 13, wherein said marker element is incorporated in said means for supporting said workpiece in said chamber.

18. An apparatus, as set forth in claim 17 wherein said means for supporting said workpiece in said chamber includes a collar surrounding an electrostatic chuck on which said workpiece is mounted, said marker element being incorporated in said collar.

19. An apparatus, as set forth in claim 13, wherein said means for analyzing the composition of exhaust gases discharged from said chamber during cleaning of the chamber includes an optical emission spectrometer.

* * * * *